United States Patent [19]

Comeau

[11] Patent Number: 5,606,328
[45] Date of Patent: Feb. 25, 1997

[54] RF ISOLATION INSPECTION TOOL

[75] Inventor: Joseph F. Comeau, Thousand Oaks, Calif.

[73] Assignee: Hughes Electronics, Los Angeles, Calif.

[21] Appl. No.: 578,841

[22] Filed: Dec. 26, 1995

[51] Int. Cl.$^6$ ............................ H01Q 13/10; G01R 29/08
[52] U.S. Cl. ............................... 343/703; 343/770; 324/95
[58] Field of Search ..................................... 343/703, 767, 343/770; 324/95; 340/600; 455/67, 115, 326

[56] References Cited

U.S. PATENT DOCUMENTS

| 4,571,581 | 2/1986 | Smith et al. | 343/95 |
| 5,136,304 | 8/1992 | Peters | 343/703 |
| 5,423,072 | 6/1995 | Iwashita et al. | 343/703 |

FOREIGN PATENT DOCUMENTS

| 0128469 | 5/1991 | Japan | 343/703 |
| 6160449 | 6/1994 | Japan | 343/703 |

Primary Examiner—Donald T. Hajec
Assistant Examiner—Tan Ho
Attorney, Agent, or Firm—Leonard A. Alkov; Wanda K. Denson-Low

[57] ABSTRACT

An RF inspection tool in for testing RF leakage of a slot radiator antenna array. The inspection tool comprises a vacuum chamber having a cover with a flexible metal diaphragm. The periphery of the cover seals to a base structure by means of an O-ring seal. The flexible diaphragm preferably comprises an aluminum sheet that conforms to the face of the antenna array when a vacuum is created within the tool. The flexible diaphragm has a plurality of flanges bonded thereto that allow access to and provide test points for the radiating slots of the antenna array. The flexible diaphragm is pulled toward the face of the antenna array when a vacuum is formed, and provides a tight seal against the face of the antenna array. The seal prevents RF leakage out of radiator slots of the antenna array. A network analyzer is used to transmit and receive RF energy through the flanges which are disposed adjacent different modules of the antenna array. Crosstalk or electrical leakage is measured using the network analyzer. The present RF inspection tool has excellent RF blockage between modules and very minor defects in the antenna array may be easily located, such as the quality of braze joints of the antenna array that cannot be visually checked due to their internal locations.

4 Claims, 1 Drawing Sheet

RF ISOLATION INSPECTION TOOL

BACKGROUND

The present invention relates generally to RF inspection tools, and more particularly, to an RF inspection tool for testing RF leakage between modules of slot radiator antennas.

The prior technique for testing RF leakage between modules of slot radiator antennas involved the use of strips of aluminum tape that were placed over all of the non-used radiator slots of the modules of a slot radiator antenna that was to be tested. A network analyzer was then attached to the face of the array for checking leakage between modules. Distortion of the face of the array and the glue under the aluminum tape created gaps that permitted electrical RF leakage, thus distorting and sometimes rendering tests unreliable.

Consequently, there has been a need for improved test hardware that provides for reliable RF leakage testing of modules of slot radiator antennas. Accordingly, it is an objective of the present invention to provide for an RF inspection tool for testing RF leakage between modules of slot radiator antennas that improves upon the unreliable testing techniques of the prior art.

SUMMARY OF THE INVENTION

To meet the above and other objectives, the present invention is an RF inspection tool in that is used to test RF leakage of an antenna array of a slot radiator antenna. The present invention comprises a vacuum chamber having a cover that includes a flexible metal diaphragm. The periphery of the cover seals to a base structure by means of an O-ring seal. The flexible diaphragm preferably comprises an aluminum sheet having a thickness of about 5 mil that is able to conform to the face of an antenna array when a vacuum is created. The flexible diaphragm has a number of flanges bonded thereto that allow access to and provide test points for the radiating slots of the antenna array under test.

The present invention may be used to check the quality of braze joints of the antenna array that cannot be visually checked due to their locations internal to the antenna array. The flexible diaphragm is pulled toward the face of the antenna array when a vacuum is formed, thus forming a tight seal against the face of the antenna array. The tight seal prevents RF leakage out of the radiator slots of the antenna array. A network analyzer is used to transmit and receive RF energy through flanges located in different modules of the antenna array. Crosstalk or electrical leakage is measured using the network analyzer. The present RF inspection tool has excellent RF blockage capability between modules and very minor defects in the array may be easily located.

The present RF inspection tool was designed to test antenna panels of F1A-18 antenna arrays, but may be adapted for use in testing visually all slotted array antennas where perfect braze integrity is required.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
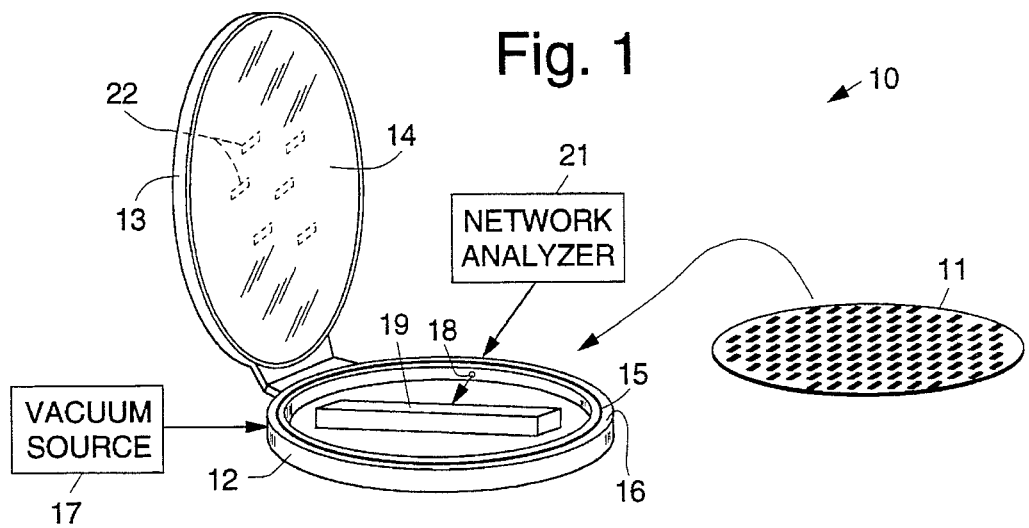
FIGS. 1 and 2 illustrate an RF inspection tool in accordance with the principles of the present invention that is used to test RF leakage of an antenna array of a slot radiator antenna.
Figure 2:
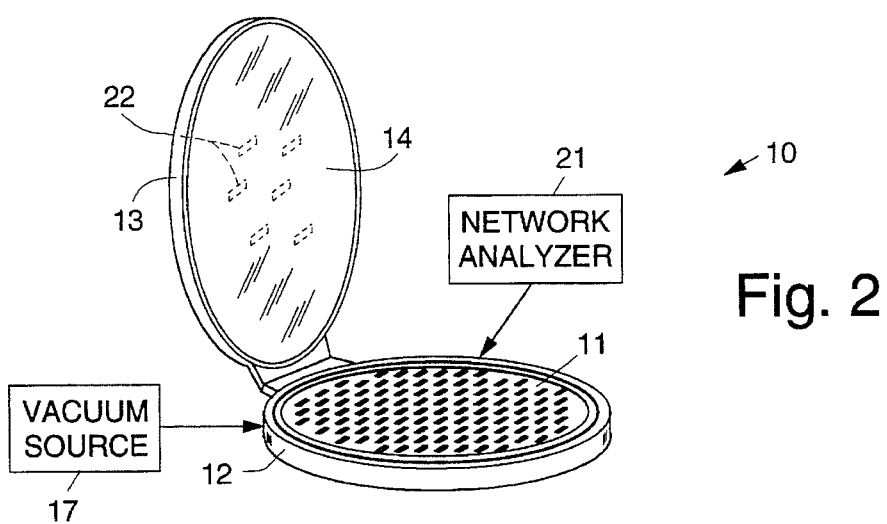

Referring now to the drawing figures, FIGS. 1 and 2 illustrate an RF inspection tool 10 in accordance with the principles of the present invention that is used to test RF leakage of an antenna array 11 of a slot radiator antenna 11. The RF inspection tool 10 has a welded base structure 12 configured in the general shape of a slot radiator antenna 11 that is to be tested. The RF inspection tool 10 includes a hinged cover 13 comprising a ring that secures a flexible diaphragm 14 at the periphery thereof. The flexible diaphragm 14 may comprise a metal sheet, such as an aluminum sheet, for example, glued or otherwise affixed to an edge of the hinged cover 13. A plurality of flanges 22 are disposed on an outer surface of the flexible diaphragm 14 that are located in different modules of the antenna array 11. The base structure 12 has an O-ring groove 15 disposed at a joining or mating surface 16 between the base structure 12 and the hinged cover 13. The hinged cover 13 mates with the base structure 12 to provide an air-tight seal when the two are closed together.

The RF inspection tool 10 is coupled to a vacuum source 17 and when the hinged cover 13 and flexible diaphragm 14 are mated to the base structure 12, a vacuum may be formed within an interior space of the tool 10. An RF input connector 18 or connectors 18 are disposed through the base structure 12 that permit coupling of RF energy to an RF transmit module 19 disposed within the interior space of the tool 10. The antenna array 11 of the slot radiator antenna 11 is disposed face up within the base structure 12 so that it can receive energy coupled by the RF transmit module 19.

Figure 3:
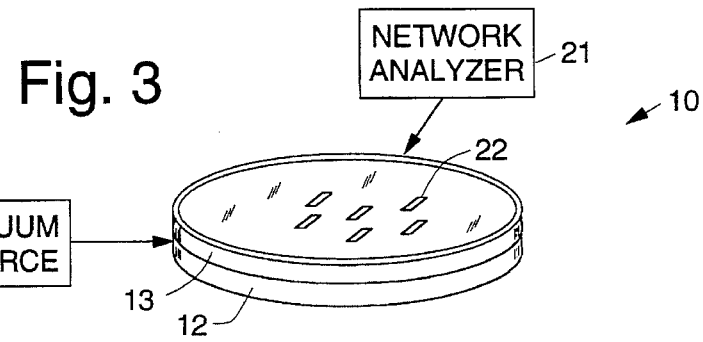
FIG. 3 illustrates the RF inspection tool in a closed position prior to testing of the antenna array.
Figure 4:
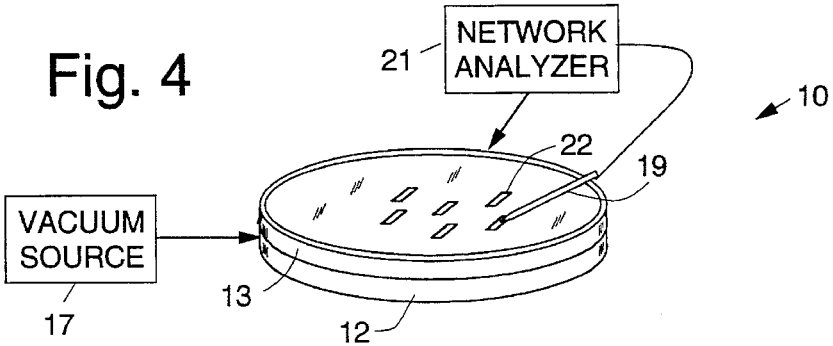
FIG. 4 illustrates testing of the antenna array using the RF inspection tool.

FIG. 3 illustrates the RF inspection tool 10 in a closed position prior to testing of the antenna array 11, and FIG. 4 illustrates testing of an antenna array 11 using the RF inspection tool 10. In operation, the hinged cover 13 is closed and a vacuum is created within the tool 10 causing intimate contact between the face of the slotted antenna array 11 and the flexible diaphragm 14. The tight seal prevents RF leakage out of radiator slots of the antenna array 11. Testing of isolation between portions (or modules) of the antenna array 11 is performed while the antenna array 11 is under vacuum. This is achieved using a network analyzer 21 that has an RF sensor that is used to probe the flanges 22 to determine if RF leakage occurs between modules of the antenna array 11.

The network analyzer 21 is used to transmit and receive RF energy through the flanges 22 located in different modules of the antenna array 11. Crosstalk or electrical leakage is measured using the network analyzer 21. The present invention may be used to check the quality of braze joints of the antenna array 11 that cannot be visually checked due to their internal locations within the antenna array 11. The present RF inspection tool 10 has excellent RF blockage capability between modules and very minor defects in the array 11 may be easily located. The RF inspection tool 10 may be used to test slotted antenna arrays 11 that require perfect braze integrity.

Thus, an RF inspection tool for testing RF leakage of slot radiator antennas has been disclosed. It is to be understood that the described embodiment is merely illustrative of some of the many specific embodiments which represent applications of the principles of the present invention. Clearly, numerous and varied other arrangements may be readily devised by those skilled in the art without departing from the scope of the invention.

What is claimed is:

1. An RF inspection tool for testing RF leakage of an antenna array comprising a plurality of slot radiator antennas, said RF inspection tool comprising:

a base structure;

a hinged cover coupled to the base structure that comprises a ring that secures a flexible diaphragm at the periphery thereof, and wherein the flexible diaphragm comprises a plurality of flanges disposed at predetermined locations thereon;

an O-ring groove disposed in the base structure at a mating surface between the base structure and the hinged cover;

a vacuum source coupled to the base structure for forming a vacuum within an interior space of the tool when the hinged cover is closed against the base structure;

an RF input connector disposed through the base structure that permits coupling of RF energy to the antenna array;

wherein the antenna array is disposed face up in the interior space of the tool so that the face of the antenna array and the flexible diaphragm is drawn into contact with each other when the vacuum is formed and such that the flexible diaphragm prevents RF leakage out of the radiator slots of the antenna array; and a network analyzer having an RF output coupled to the RF input connector that is used to couple RF energy to the antenna array and having an RF sensor that is used to probe the flanges disposed on the flexible diaphragm to determine if RF leakage occurs between modules when the antenna is operational.

2. The inspection tool of claim 1 wherein the flexible diaphragm comprises a metal sheet glued to an edge of the hinged cover.

3. The inspection tool of claim 2 wherein the metal sheet comprises an aluminum sheet affixed to an edge of the hinged cover.

4. The inspection tool of claim 1 wherein the base structure is configured in the general shape of the slot radiator antenna array.

\* \* \* \* \*